(12) United States Patent
Park et al.

(10) Patent No.: US 6,316,825 B1
(45) Date of Patent: Nov. 13, 2001

(54) CHIP STACK PACKAGE UTILIZING A CONNECTING HOLE TO IMPROVE ELECTRICAL CONNECTION BETWEEN LEADFRAMES

(75) Inventors: Myung Geun Park, Seoul; Chang Jun Park, Kyoungki-do; Nam Soo Lee, Kyoungki-do; Hyung Gil Baik, Kyounki-do; Yoon Hwa Choi, Kyoungki-do, all of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/309,399

(22) Filed: May 10, 1999

(30) Foreign Application Priority Data

May 15, 1998 (KR) .................................. 98-17500

(51) Int. Cl.[7] .................................. H01L 23/02
(52) U.S. Cl. .................. 257/686; 257/666; 257/676; 257/724; 257/784; 257/787; 361/723; 361/813
(58) Field of Search .................... 257/667, 670, 257/676, 685, 686, 723, 724, 784, 666, 669, 672, 674, 787; 361/723, 813; 438/123

(56) References Cited

U.S. PATENT DOCUMENTS

| | | | |
|---|---|---|---|
| 5,327,327 | 7/1994 | Frew et al. | 361/784 |
| 5,343,366 | 8/1994 | Cipolla et al. | 361/785 |
| 5,514,907 | 5/1996 | Moshayedi | 257/723 |
| 5,600,541 | 2/1997 | Bone et al. | 361/707 |
| 5,612,570 | 3/1997 | Eide et al. | 257/686 |
| 5,625,221 * | 4/1997 | Kim et al. | 257/686 |
| 5,781,413 | 7/1998 | Howell et al. | 361/777 |
| 5,818,107 | 10/1998 | Pierson et al. | 257/723 |
| 5,821,625 | 10/1998 | Yoshida et al. | 257/777 |
| 5,987,739 * | 11/1999 | Lake | 29/841 |
| 6,059,952 * | 5/2000 | Kang et al. | 205/143 |

FOREIGN PATENT DOCUMENTS

| | | | |
|---|---|---|---|
| 2-292851 | * | 12/1990 | (JP) . |
| 4-67662 | * | 3/1992 | (JP) . |
| 4-7064 | * | 7/1992 | (JP) . |
| 5-82720 | * | 4/1993 | (JP) . |
| 07221255 | | 8/1995 | (JP) . |

OTHER PUBLICATIONS

"Electronic Packaging & interconnection Handbook", McGraw Hill Inc.; 2nd Edition, Harper, 1997, pp. 5.4 and 5.5.*

* cited by examiner

*Primary Examiner*—Olik Chaudhuri
*Assistant Examiner*—Alonzo Chambliss
(74) *Attorney, Agent, or Firm*—Ladas & Parry

(57) ABSTRACT

The present invention relates to a stack package, as well as a method for fabricating the same, the stack package includes at least two semiconductor chips disposed up and down. Bonding pads are formed in the respective semiconductor chips along a center line. Inner leads of a first lead frame and a second lead frame are attached to bonding pad-disposed faces of the respective semiconductor chips. The inner lead of each lead frame is electrically connected to its corresponding bonding pad by means of metal wires. The inner lead of the first lead frame is also electrically connected to the second lead frame. The entire structure is molded with an epoxy compound so as to expose a connecting part between the first and second lead frames and an outer lead of the second lead frame.

6 Claims, 11 Drawing Sheets

CHIP STACK PACKAGE UTILIZING A CONNECTING HOLE TO IMPROVE ELECTRICAL CONNECTION BETWEEN LEADFRAMES

BACKGROUND OF THE INVENTION

1. Field of the Invention

The present invention relates to a stack package and method for fabricating the same, particularly the stack package is characterized in that one package consists at least two semiconductor chips stacked therein.

2. Description of the Related Art

Rapid progress in the memory chip has been presented to increase memory capacity. Currently, 128M DRAM is mass-produced, and also the mass-production of 256M DRAM will be available sooner or later.

For increasing memory chip capacity, i.e. high integration, a technology for inserting cells as many as possible into a given area of semiconductor device, is widely known. However, this method requires high technology such as a precise line width and a considerable amount of time for development. Accordingly, a relatively simpler stacking technology to optimize integrity of the semiconductor device has been developed most recently.

The term stacking used in semiconductor industry means a technique to double the memory capacity by heaping up at least two semiconductor chips in a vertical direction. According to the stacking technique, a 128M DRAM device can be constituted by two 64M DRAM devices for instance, also a 256M DRAM device can be constituted by two 128M DRAM devices.

There are various applications of the stacking such as, stacking for semiconductor devices, stacking for packages or modules. Stacking for packages means that pre-formed packages are stacked in several layers or more. This stacking is regarded as a cost-effective method. There are two types of package stacking technology. For instance, packages ready-made upon order are used and each lead of the packages is connected to its corresponding lead. The other stacking technology uses standard packages which are connected by side rails or accessories similar to the side rails.

Figure 1:
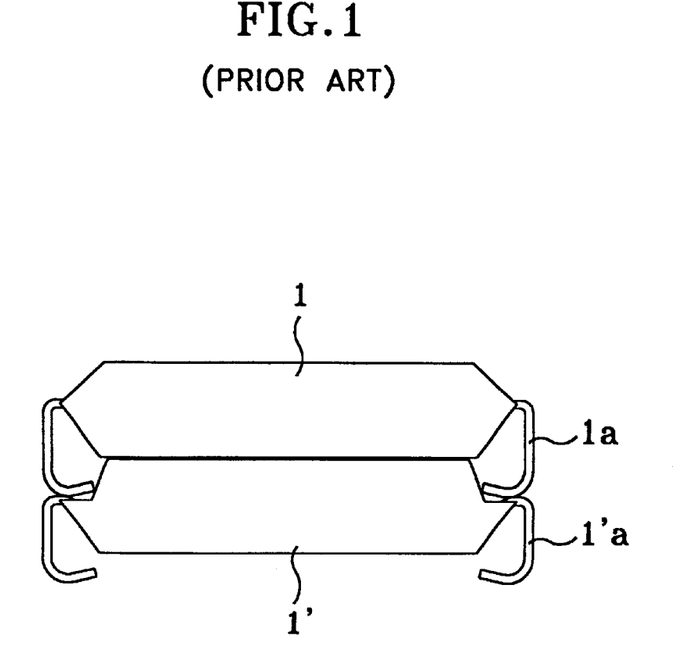
FIG. 1 is a cross-sectional view of a conventional stack package.
Figure 2:
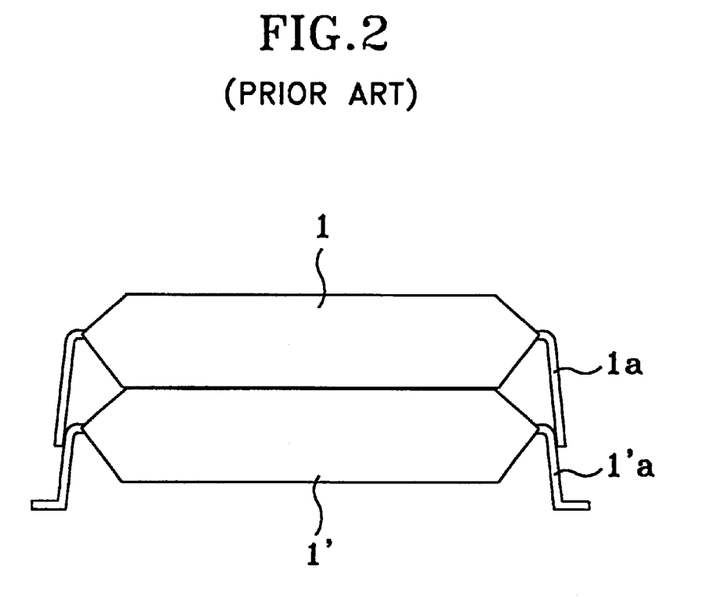
FIG. 2 is a cross-sectional view of another conventional stack package.

Hereinafter, a brief description regarding the above-mentioned typical stacking technology for packages is given with reference to FIGS. 1 and 2.

As shown in the drawings, a bottom surface of an upper package 1 is faced with a top surface of a lower package 1'. In the respective packages, leads 1a, 1b being projected from both sides of the packages are electrically connected. Although only two packages are shown in the drawings, however more packages can be stacked. Furthermore, leads of the stack packages are connected by side rails or auxiliary accessories similar to the side rails.

However, the package as described above incurs following problems. Since two or more packages are stacked, the size of package is increased and therefore it is very difficult to handle with the package. A number of steps, mostly in molding step and forming step are also added or transformed. Particularly, it is possible to stack only provided that the leads are transformed, even when the step for forming is already performed, and sometimes it is impossible to stack due to the work condition which depends on width or space of the leads.

On the other hand, to solve the foregoing problems a stack package comprising at least two semiconductor chips in a package is disclosed in Japanese Patent Laid-open No. 62-8529, No. 62-131555 and No. 63-124450. Those references, however have following problems respectively.

The Japanese Patent Laid-open No. 62-8529 and No. 62-131555 disclose a stack package having semiconductor chips mounted on both sides of a tape automated bonding (hereinafter referred as to TAB) tape. In that structure, a wire bonding step is preferentially performed, i.e. a bonding pad disposed on one side of the semiconductor chip is connected to a lead frame by means of a metal wire. Afterward, a subsequent wire bonding step follows, i.e. another bonding pad disposed on the other side of the semiconductor chip is connected to another lead frame by means of a metal wire. While the subsequent wire bonding steps are performed, the metal wire which is already connected during the precedent wire bonding step, is often damaged.

Also, the Japanese Patent Laid-open No. 63-124450 discloses a stack package that a two-layered lead frame is molded with an epoxy compound. However, it is difficult to mass-produce the stack package as constituted above according to the currently used transfer molding technique.

In addition, the Japanese Patent Laid-open No. 63-119952 discloses a stack package having a structure that its lead frames are connected each other. However, in the stack package, it is difficult to form a lead frame for connecting lead frames which are already made before molding the structure. Moreover, this structure expands package size opposite to the high integration trend in the package industry.

SUMMARY OF THE INVENTION

The present invention is directed to provide a stack package having a superior electrical property and a method for fabricating the same. Herein, the stack package comprises at least two semiconductor chips within one package that the package can be made of the materials and fabricated by the technologies which are currently used in common resin-molding type semiconductor packages. By doing so, capacity of the package can be doubled, the package can be highly integrated, manufacturing cost thereof can be reduced and mass-production is also available.

The stack package according to the present invention, includes at least two semiconductor chips disposed up and down. Bonding pads are formed in the respective semiconductor chips along a center line. Inner leads of first and second lead frames are attached to bonding pad-disposed faces of the respective semiconductor chips. The respective inner leads are electrically connected to their corresponding bonding pads by means of metal wires and the inner lead of the first lead frame is electrically connected to the second lead frame. The entire structure is molded with an epoxy compound so as to expose a connecting part between the first and second lead frames and an outer lead of the second lead frame.

Herein, the first and second semiconductor chips can be disposed such that their bonding pad-disposed faces, or the reverse of the bonding pad-disposed faces are opposed each other. Otherwise, the bonding pad-disposed faces can be disposed upwardly or downwardly. The inner leads of the respective lead frames can be set upwardly or downwardly so as to prevent short in the metal wires.

Solder joints for aiding the electrical connection between both lead frames are formed at the second lead frame region outside of the epoxy compound to which an outer end of the first lead frame is connected. Also, semicircular, circular or rectangular shaped connecting holes are formed in an outer end of the first lead frame which is connected to the second lead frame for obtaining a large contact area of the outer end and the second lead frame. And, to avoid mismatching the corresponding lead frames, the width of the first lead frames is preferably shorter than that of the second lead frames.

The method for fabricating the stack package as constituted above will be described hereinafter.

At least two semiconductor chips having a plurality of bonding pads disposed with a regular spacing in the center region of the semiconductor chip are fabricated and prepared. First and second lead frames constituting paths for transmitting signals outwardly are fabricated and prepared. Inner leads of the respective lead frames are attached to bonding pad-disposed faces of the semiconductor chips respectively. The inner leads are electrically connected to the bonding pads by means of metal wires. A region being contacted an outer end of the first lead frame and the second lead frame is coated with a conductive adhesive. They are faced each other and are under jointing process while heating at a temperature of melting point of the conductive material. Finally, the entire structure is molded with an epoxy compound to expose an outer lead of the second lead frame.

According to the present invention, since the stack package includes at least two semiconductor chips within one package, the package can be highly integrated and can be made of the materials and fabricated by the technologies which are currently used in common resin-molding type semiconductor packages. Therefore, manufacturing cost can be reduced and mass-production is available.

DETAILED DESCRIPTION OF THE PREFERRED EMBODIMENTS

Reference numerals 10 and 10' stand for semiconductor chips, 20 and 20' for lead frames, 30 and 30' for adhesive tapes, 40 and 40' for metal wires, 50 for an epoxy compound and 60 for a conductive adhesive material.

Figure 3:
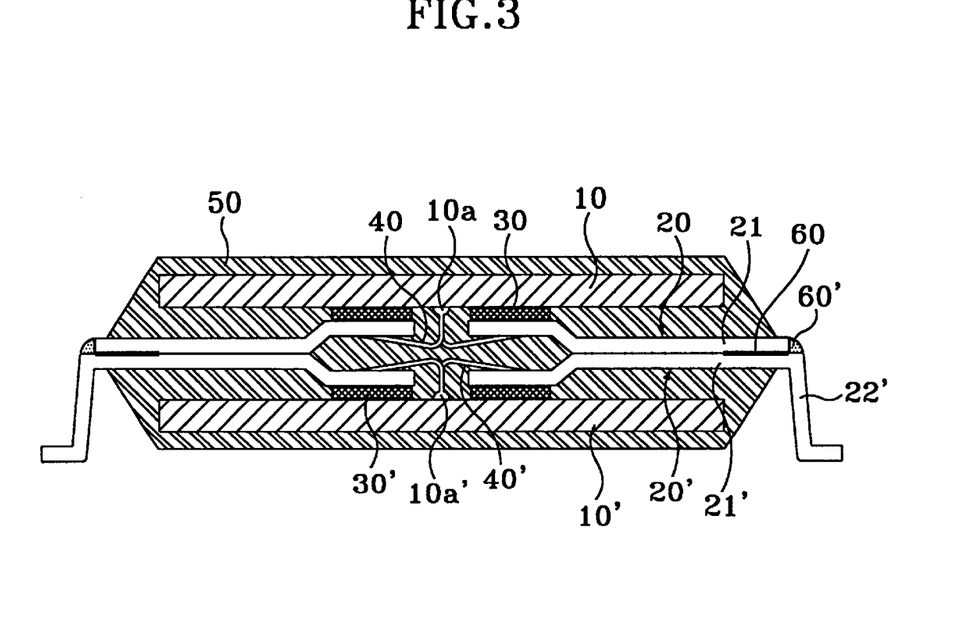
FIG. 3 is a cross-sectional view of a stack package according to a first embodiment of the present invention.
Figure 4:
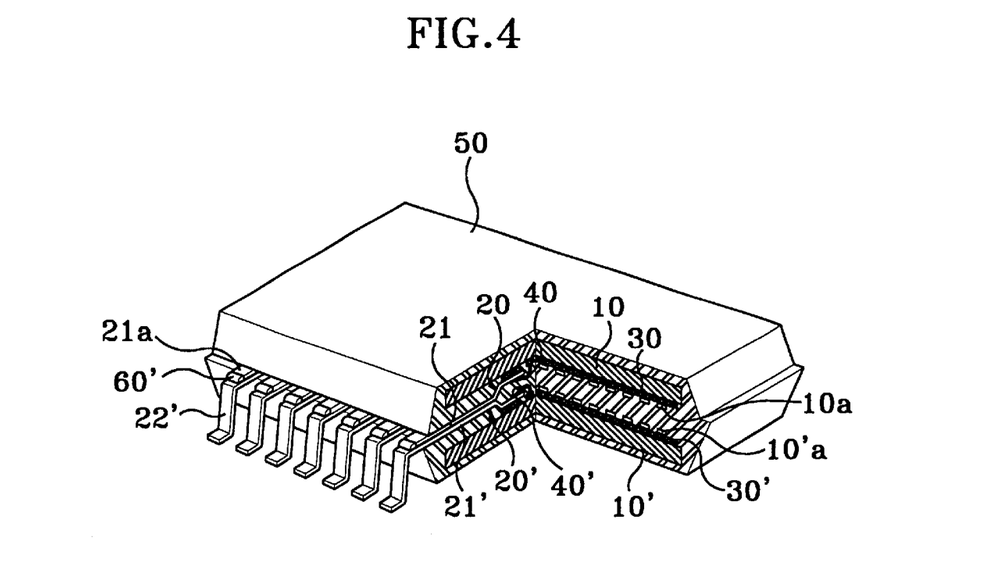
FIG. 4 is a partial perspective view showing inside of the stack package according to the first embodiment of the present invention.

As shown in FIGS. 3 and 4, two semiconductor chips 10,10' are disposed up and down with a regular spacing so that their bonding pad-disposed faces 10a,10a' are opposed each other. A first lead frame 20 and a second lead frame 20' are attached by means of adhesive tapes 30,30' respectively to the bonding pad-disposed faces 10a,10a', i.e. a bottom surface of the first semiconductor 10 in upper position and a top surface of the second semiconductor 10' in lower position. Inner leads 21,21a of a first lead frame 20 and a second lead frame 20' are electrically connected to their corresponding bonding pads 10a,10a ' by means of metal wires 40,40'. The entire resultant structure is molded with an epoxy compound to expose an outer end of the first lead frame 20 and an outer lead 22' of the second lead frame 20'.

Figure 7:
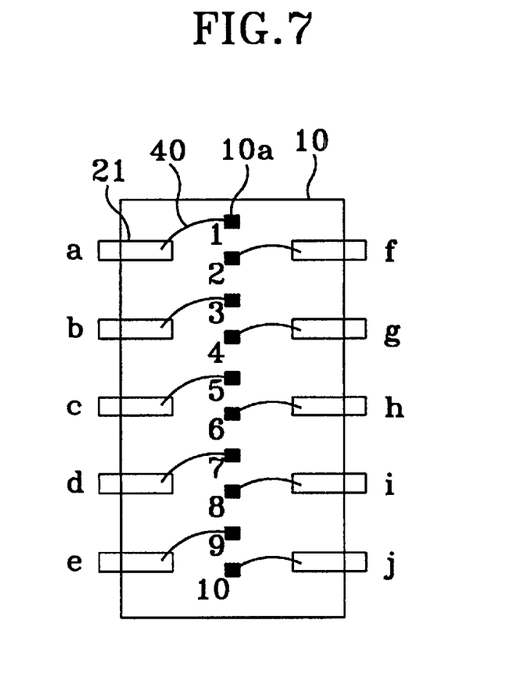
FIG. 7 is a planar view illustrating a reverse wire bonding condition between the first lead frame and a semiconductor chip according to the first embodiment.
Figure 8:
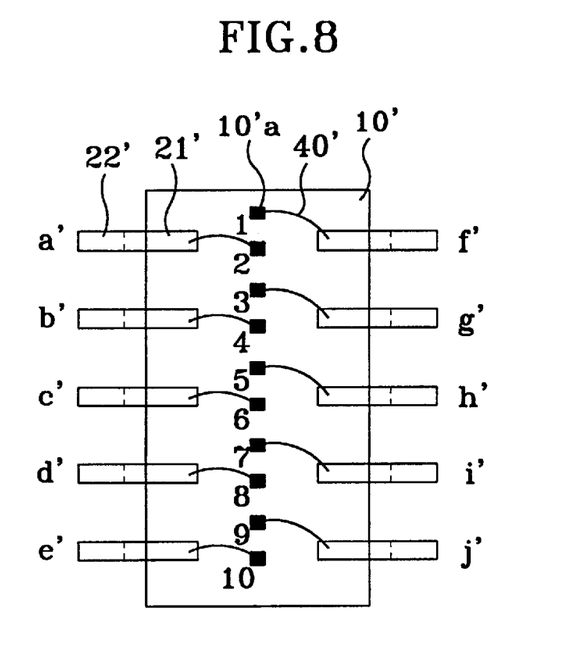
FIG. 8 is a planar view illustrating a wire bonding condition between the second lead frame and a semiconductor chip according to the first embodiment.

As shown in FIGS. 7 and 8, the bonding pads 10a,10a' of the respective semiconductor chips 10,10' are formed with a regular spacing in a center region of the respective semiconductor chips 10,10' along the lengthwise direction thereof.

Figure 5:
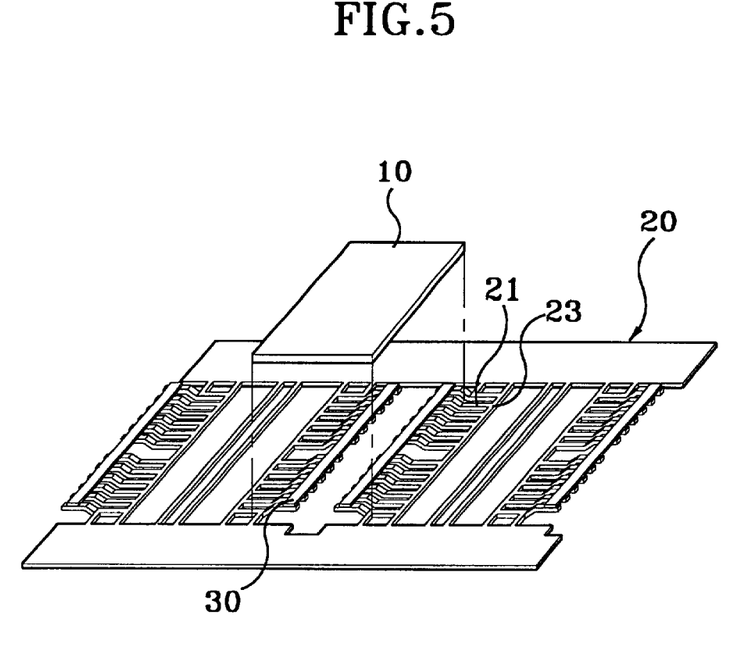
FIG. 5 is a perspective view of a first lead frame (i.e. upper lead frame) which is used in the stack package of the first embodiment.
Figure 6:
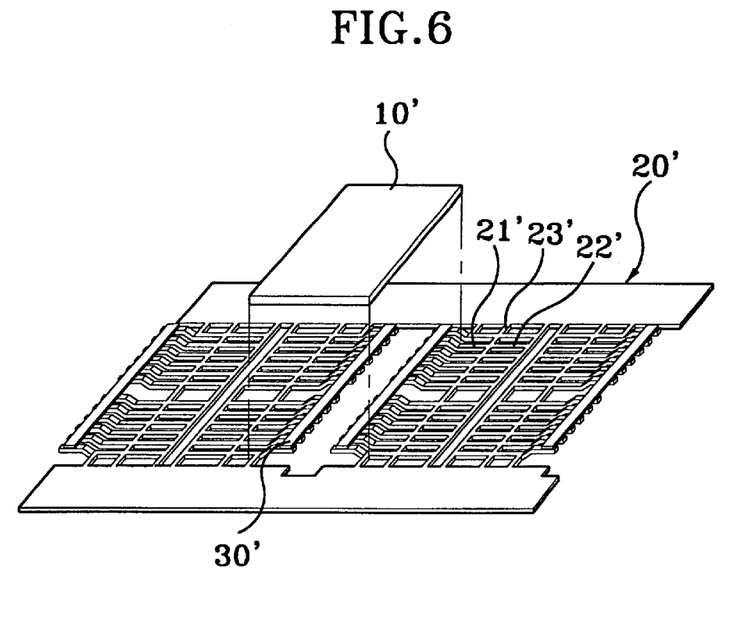
FIG. 6 is a perspective view of a second lead frame (i.e. lower lead frame) which is used in the stack package of the first embodiment.

As shown in FIGS. 5 and 6, the first lead frame 20 has a plurality of inner leads 21 excluding outer lead while the second lead frame 20' has an inner lead 21' and an outer lead 22' which is extended from the inner lead 21' and is projected outside of the epoxy compound 50. In the meantime, reference numeral 23, 23' in FIGS. 5 and 6 stands for a dam bar connecting the respective lead frames 20,20'.

These first and second lead frames 20,20' as shown in FIG. 3, are electrically connected each other since their inner leads 21,21' are in contact with themselves. Accordingly, a predetermined signal is inputted/outputted from/to their corresponding bonding pads 10a,10a' of the respective semiconductor chips 10,10' through the respective lead frames 20,20' constituting a path.

Further, the inner lead 21 of the first lead frame 20 is locally set upwardly and the inner lead 21' of the second lead frame 20' is locally set downwardly thereby providing a predetermined space. The space prevents the short between the lead frames 20,20' and in the metal wires 40,40'.

Figure 12:
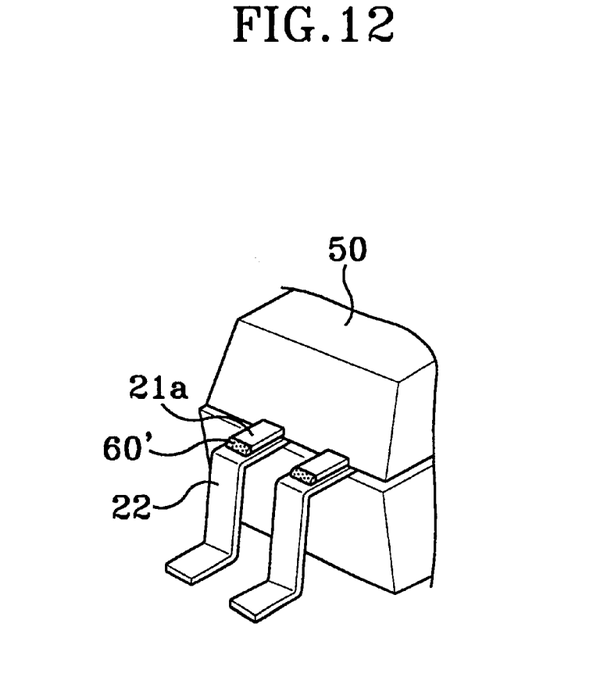
FIG. 12 is a perspective view showing a connection between the first and second lead frames according to the first embodiment.
Figure 13A:
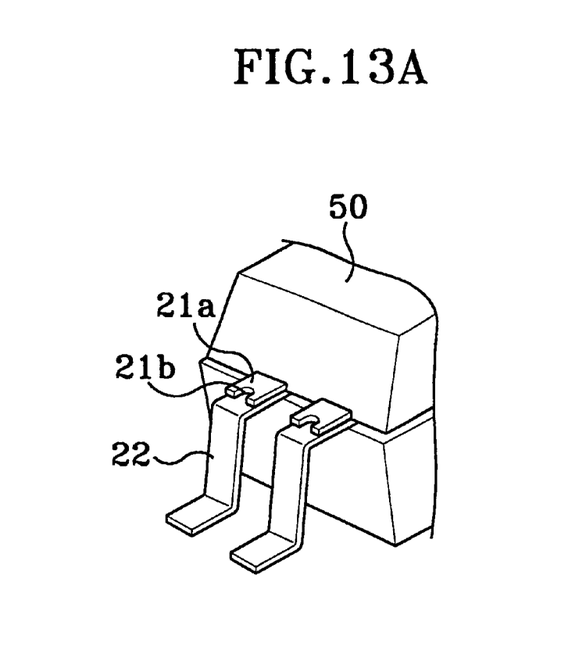
FIGS. 13A to 13C are another perspective views showing a connection between the first and second lead frames according to the first embodiment.
Figure 13B:
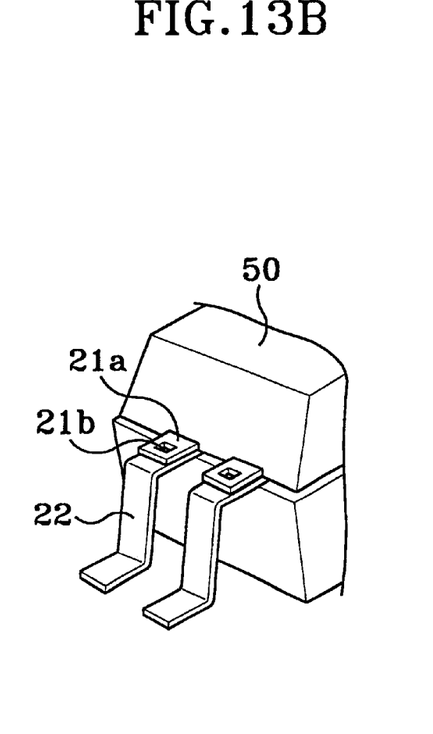
Figure 13C:
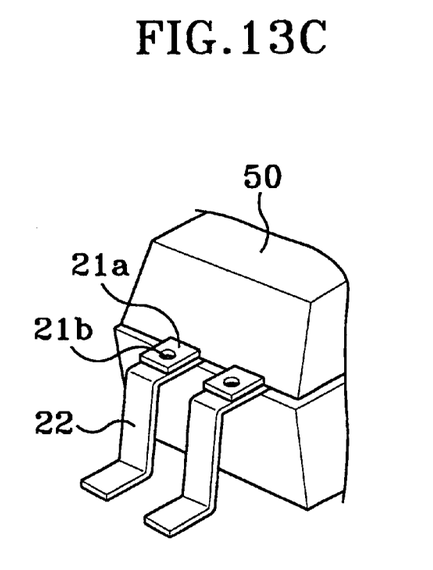

On the other hand, to obtain a desired operating property of the stack package having aforementioned structure, it is required to ensure a reliability in the electric connection between the respective lead frames 20,20'. In the present invention, a conductive adhesive 60 is provided at contact faces of the inner leads 21,21' so as to ensure such reliability. As shown in FIGS. 3 and 12, a solder joint 60' is formed at a selected portion of the second lead frame 20' which is contacted with an outer end 21a of the inner lead 21 of the first lead frame 20 being exposed from the epoxy compound 50. In addition, as shown in FIGS. 13A to 13C, a semicircular, a circular or a rectangular shaped connecting hole 21b is formed in the outer end 21a of the inner lead 21 of the first lead frame 20. The connecting hole 21b increases the surface area of the outer end 21a thereby firmly ensuring the electrical connection between the lead frames 20,20' while solder jointing or Sn-plating.

Figure 14:
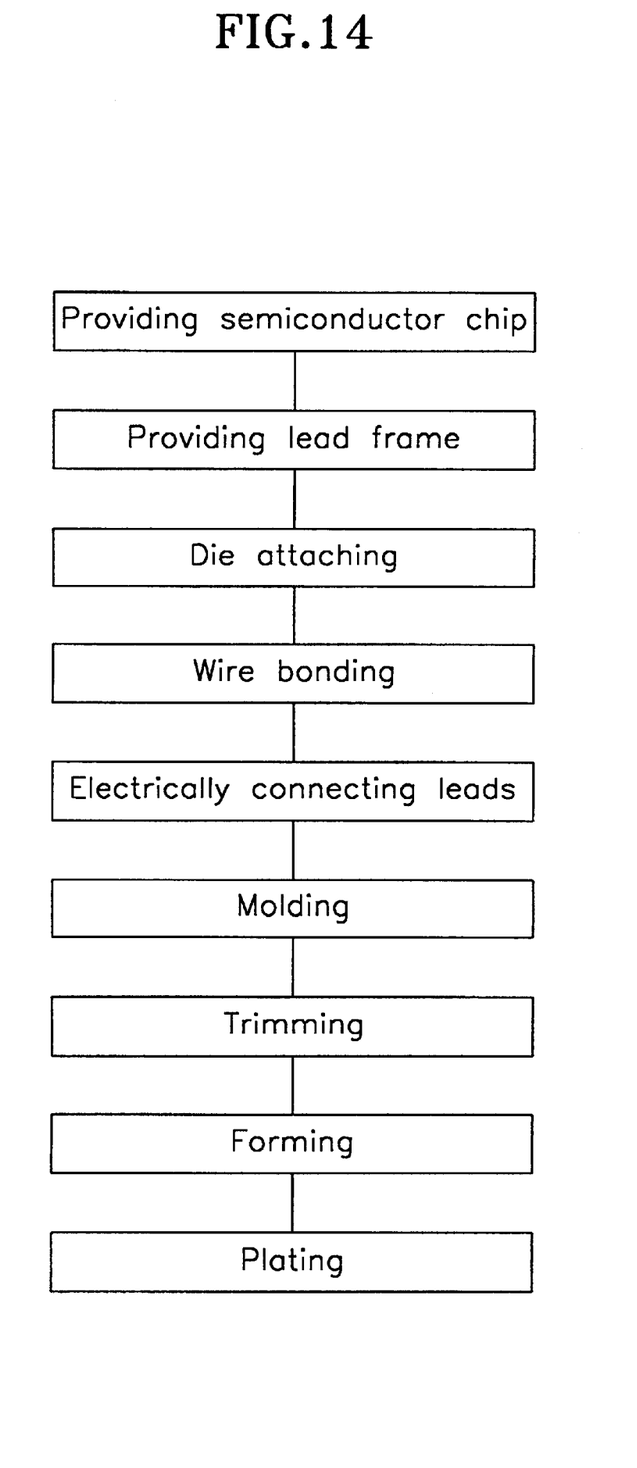
FIG. 14 shows steps for fabricating the stack package according to the first embodiment.

Hereinafter, a method for fabricating a stack package having foregoing constitutions according to a first embodiment with reference to FIG. 14.

The stack package of the present invention is made of the materials and fabricated by technologies which are currently used in common resin-molding type semiconductor packages, therefore the package can be manufactured with a reduced size, compared to other stack packages.

At first, at least two semiconductor chips having a plurality of bonding pads disposed with a regular spacing in a center region of the semiconductor chips are fabricated and prepared. First and second lead frames constituting paths for transmitting signals outwardly are fabricated and prepared. Inner leads of the respective lead frames are attached to bonding pad-disposed faces of the semiconductor chips respectively. The inner leads of the lead frames are electrically connected to the bonding pads by means of metal wires. A region being contacted an outer end of the first lead frame and a portion of the second lead frame is coated with a conductive adhesive. They are faced each other and are under jointing process while heating at a temperature of melting point of the conductive adhesive. The entire structure is molded with an epoxy compound to expose an outer lead of the second lead frame. Afterward, dam bars of the first and second lead frames are cut off simultaneously, and the lead frames are plated. Next, the outer lead of the second lead frame is curved in a selected shape thereby completing the stack package shown in FIG. 3. Among the foregoing manufacturing steps, important features thereof will be discussed hereinafter.

Referring to FIGS. 5 and 6, the first lead frame 20 and the second lead frame 20' differ from each other in their appearance. That is to say, as described above, since the outer lead of the second lead frame 20' is only used in the stack package of the present invention, the first lead frame 20 includes only an inner lead 21 and a dam bar 23 without any outer lead. Although it is not described in detail, a side rail hole of the first lead frame 20 is produced such that the side rail hole of the first lead frame 20 is coincide with that of the second lead frame 20' when the side rail hole of the first lead frame 20 is reversed. Holes used in the molding step have equal diameter to coincide the first and second lead frames 20,20'. Holes used in the trimming and forming steps are produced such that holes in the first lead frame 20 are greater than that in the second lead frame 20' enough to prevent interference in operation. The first and second lead frames 20,20' are set upwardly/downwardly by 6~8 mil. Moreover, the width of the first lead frame 20 is smaller than that of the second lead frame 20' by 3 mil in consideration of mismatching the first and second lead frames 20,20'.

After preparing the semiconductor chips 10,10' and lead frames 20,20' as described above, a die-attaching step follows. That means, the semiconductor chips are attached to the lead frames 20,20 respectively.

Next, a wire-bonding step for electrically connecting the respective semiconductor chips 10,10' and the inner leads 21,21' of the lead frames 20,20' by means of metal wires 40,40' is performed. Herein, the first lead frame 20 takes a reverse wire bonding and the second lead frame 20' takes a normal wire bonding since the semiconductor chips 10,10' are disposed such that the bonding pads-disposed faces are opposed each other. If the normal wire bonding is applied to both semiconductor chips 10,10', corresponding pads in the respective semiconductor chips 10,10' are not connected by means of one lead frame.

In addition, the connection between lead frames in the present first embodiment is a connection of lead frames which are disposed up and down. Consequently, so as to obtain a desired package property, the lead frames to be connected with one of the bonding pads at the respective semiconductor chips should be disposed to overlap themselves up and down when the semiconductor chips are stacked after wire-bonding. FIGS. 7 and 8 describe the above configuration in detail. Herein, FIG. 7 shows the reverse wire bonding of the first lead frame and FIG. 8 shows the normal wire bonding of the second lead frame. As shown in FIG. 7, a bonding pad "1" is connected to a lead "a" and in FIG. 8 the boning pad "1" is connected to a lead "f". Accordingly, after the wire bonding, when the respective semiconductor chips 10,10' are disposed such that their bonding pad-disposed faces are opposed each other, the lead "a" of the first lead frame which is connected to the bonding pad "1" is overlapped with the lead "f" of the second lead frame.

Afterward, a step for electrically connecting the overlapped region of the first and second lead frames is performed. In the stack package according to the present invention, a connection between leads is the most important matter to determine electrical property and reliability of the package. Methods for connecting between leads are as follows.

First, a method of forming a joint by clamping while molding the package is provided. In this method, additional step for lead to lead connection is not required since the leads are molded and simultaneously electrically connected according to the molding temperature and clamping pressure condition. Various methods for electrical connection between leads are as follows.

A. According to an experimental result, the molding temperature or pressure condition enables an appropriate electrical connection between the leads.

B. To complement the A method, there is a method using a lead frame having an increased surface roughness at the clamping area.

C. The electrical connection between the leads can be activated by washing the surface of the clamping area under ultrasonic or plasma environment.

D. The clamping area can be plated with Sn or can be soldered by clamping with an appropriate soldering material made of Sn/Ag, Sn/Pb or Ag. Herein, the temperature is preferably in the range of 150~200° C.

E. Similar to the D method, the clamping area can be coated with an isotropic conductive epoxy or anisotropic conductive epoxy, and the joint is formed while mold-clamping the package.

Second, a method of forming the joint before molding the package is provided. This is the adequate method for the electrical connection between leads according to an additional lead to lead connection before molding the package. Various methods for electrical connection between leads are as follows.

A. The leads can be connected by heating or mechanically pressing.

B. To complement to the A method, the leads are mechanically pressed to be connected each other by using the lead frames which has an increased surface roughness at the joint area.

C. The surface of the joint area can be activated by washing under ultrasonic or plasma environment and then mechanically pressed each other.

D. The joint area can be plated with Sn or can be soldered with by mechanically pressing an appropriate soldering material made of Sn/Ag, Sn/Pb or Ag.

E. The joint area can be coated with an isotropic conductive epoxy or anisotropic conductive epoxy.

Herein, the joint area may be an outer line or an inner line of the package. Especially in the D method, the temperature is preferably in the range of 200~260° C.

Third, a method of forming a solder joint after molding the package is provided.

A. According to an experimental result, there is formed a fillet of Sn at every boundary of the leads when the package is molded after plating with Sn. This fillet of Sn acts for aiding the electrical connection. Also the fillet of Sn can be formed at the boundaries of the leads by solder-dipping.

B. The solder joint can be formed by reflowing after coating the respective boundaries of leads with solder paste.

C. Similar to the B method, the solder joint can be made by using a conductive epoxy.

D. Otherwise, the solder joint can be made according to a combination of all methods A, B and C.

E. There is another method for increasing the joint area by forming a semicircular, a circular or a rectangular connecting hole at an end portion of the first lead frame.

Figure 9:
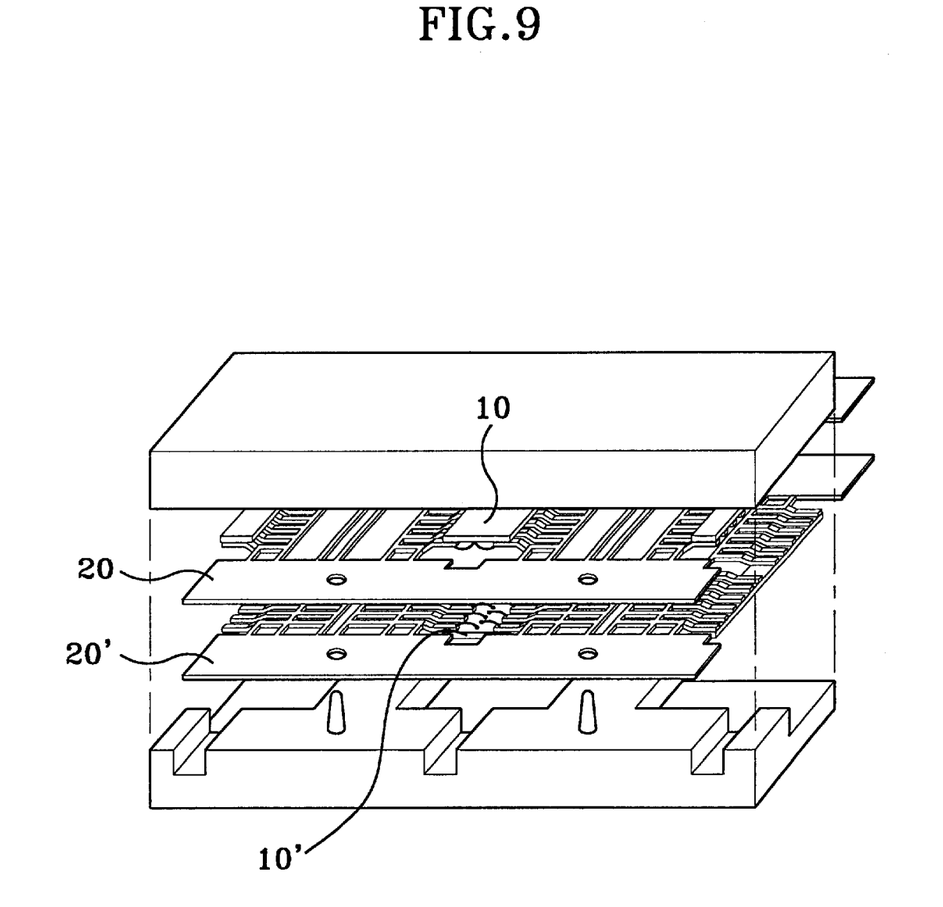
FIG. 9 is a perspective view showing a transfer-molding condition of the stack package according to the first embodiment.

The respective lead frames are electrically connected each other by taking one among the listed methods, and then the package is molded. As shown in FIG. 9, the first lead frame 20 is conversely loaded to the second lead frame 20' which is in lower position. This method for molding the package is identical to the method currently used in common resin-molding type semiconductor packages except two lead frames loaded thereto. Herein, it is needed to adjust the depth of down-setting the lead frame to prevent short in wires. The lead frames are set downwardly to avoid damages in the metal wires including the semiconductor chip when the respective lead frames are overlapped.

Figure 10:
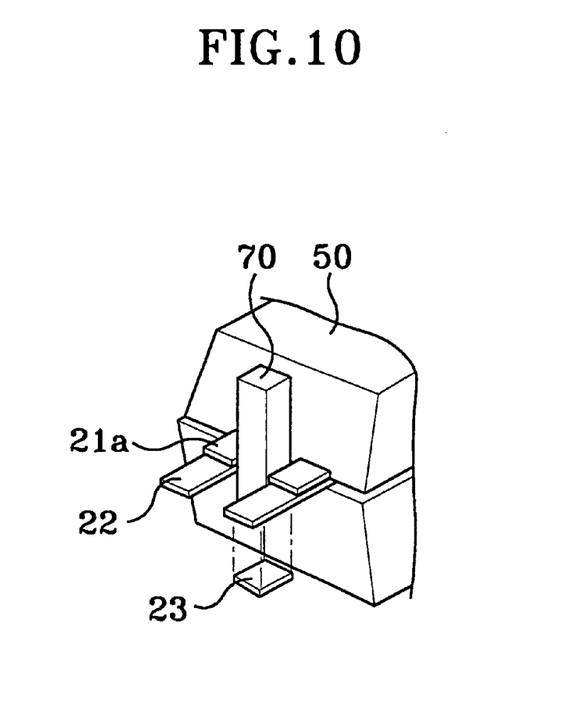
FIG. 10 is a perspective view showing a trimming process of the stack package according to the first embodiment.

A trimming step follows the molding step. As shown in FIG. 10, two overlapping dam bars 23 are cut off according to the same mechanism as used in common resin-molding type semiconductor package. The reference numeral 70 stands for a cutting tool. Herein, the width of the second lead frame 20' is produced smaller than that of the first lead frame 20 by 3 mil in consideration of mismatching the lead frames. If the lead frames are mismatched, the cutting tool can be reworked by setting an appropriate center line.

Figure 11:
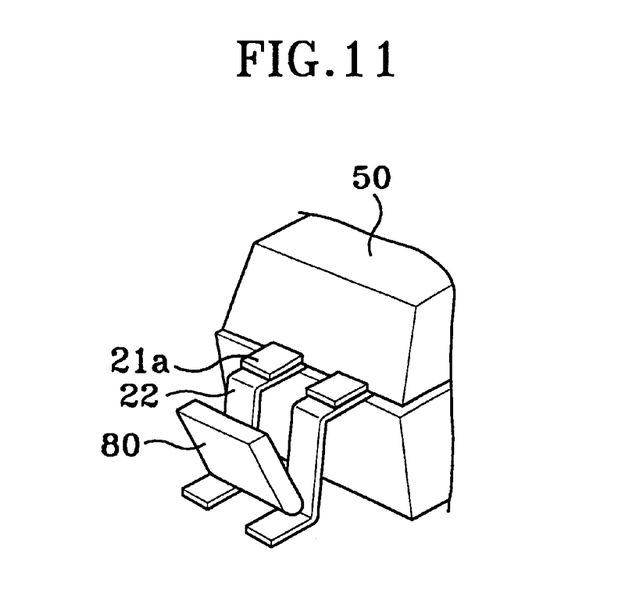
FIG. 11 is a perspective view showing a forming process of the stack package according to the first embodiment.

Afterward, the lead frames being exposed from the epoxy compound 50 are plated according to the common technologies such as solder-dipping and electroplating. Thereafter, the outer lead 22' of the second lead frame 20' which is exposed from the epoxy compound is formed in a desired shape. As shown in FIG. 11, a currently used mechanism is also applied. The reference numeral 80 stands for a forming tool.

As described above, the stack package is made of the materials and is fabricated by technologies which are currently used in common resin-molding type semiconductor packages.

In the meantime, the respective lead frames 20,20 are made of Fe—Ni based alloy or Cu alloy. As for the first and second metal wires 40,40', Al, Au or Cu can be selected. The epoxy compound 50 can be made of a phenol-based hardening agent, a silicon rubber or an epoxy resin, and a small quantity of a softening agent, a coupling agent and a coloring agent are further included in the epoxy compound 50.

In the present embodiment 1, the outer lead 22' of the second lead frame 20' which is projected outside of the epoxy compound 50, is formed in a gull-like figure. However, the formation of the outer lead 22' is not limited in that shape, the outer lead 22' can be curved toward a selected direction and formed in a selected shape, for instance the SOJ type or the DIP type.

Figure 15:
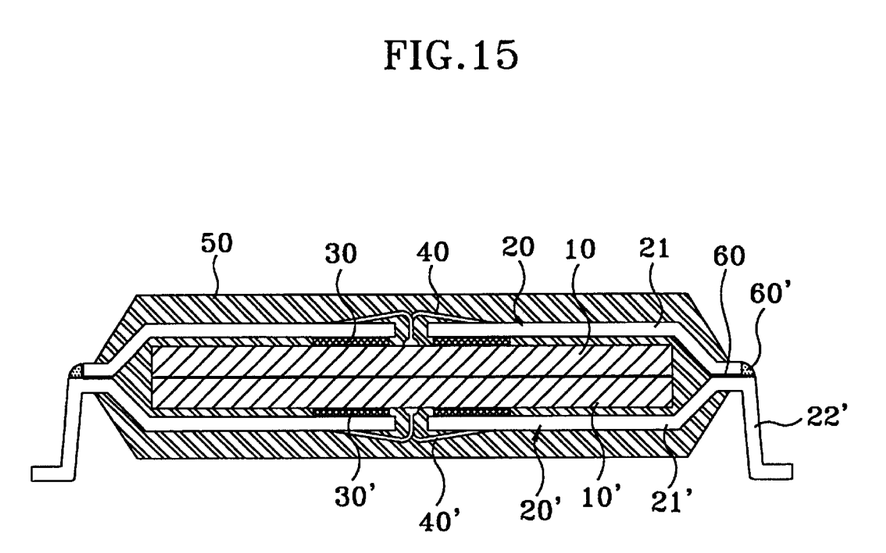
FIG. 15 is a cross-sectional view of a stack package according to a second embodiment of the present invention.
Figure 16:
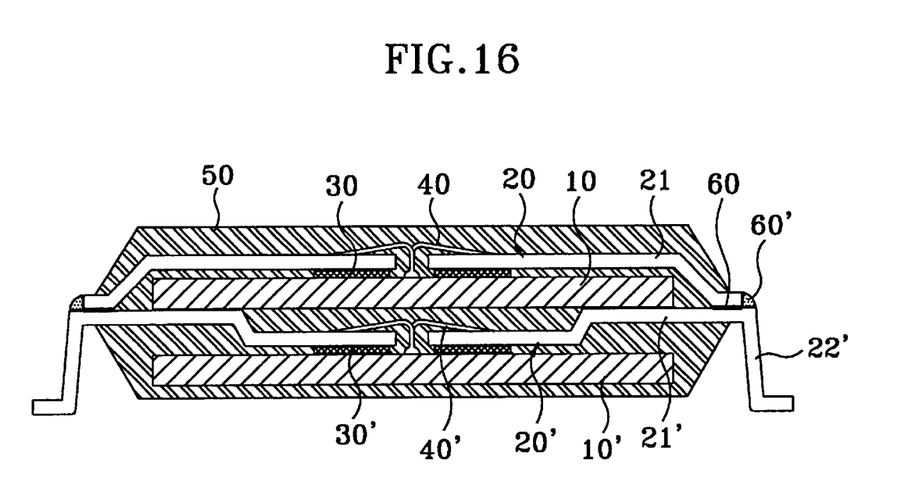
FIG. 16 is a cross-sectional view of a stack package according to a third embodiment of the present invention.
Figure 17:
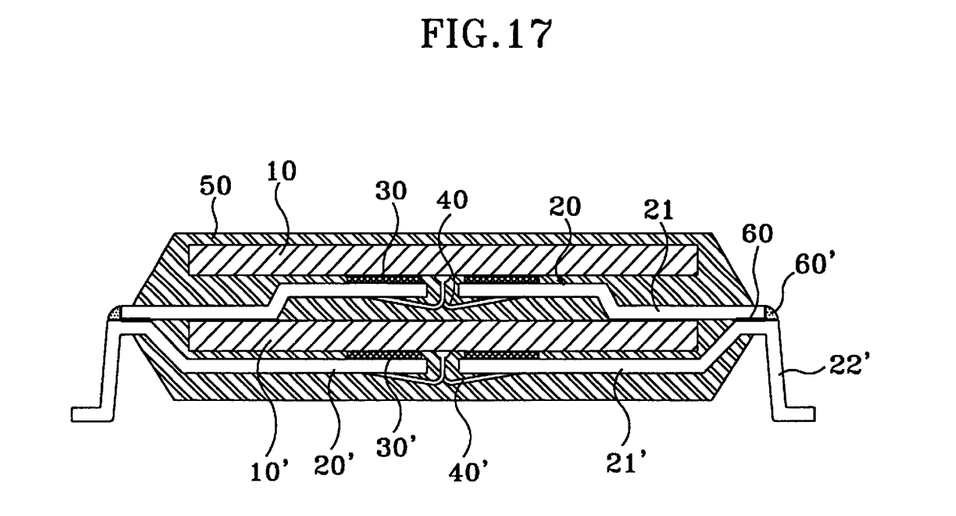
FIG. 17 is a cross-sectional view of a stack package according to a fourth embodiment of the present invention.

Furthermore, the first and second semiconductor chips 10,10' can be disposed such that their bonding pad-disposed faces or the reverse of the bonding pad disposed faces are opposed each other as shown in FIG. 15. Otherwise, as shown in FIG. 16, the bonding pad-disposed faces can be disposed upwardly, or as shown in FIG. 17 the bonding pad-disposed faces can be disposed downwardly.

The packages of second to fourth embodiments, have the same constitution with that of the first embodiment except the positioning direction of the semiconductor chips 10,10' and the up-setting or down-setting configuration of the first and second lead frames 20,20' which depends on the positioning direction of the semiconductor chips 10,10'. The packages are fabricated by the same technology of the first embodiment. Accordingly, same reference numerals are given to constitutional elements of each embodiment, and detailed description thereof is omitted.

Figure 18:
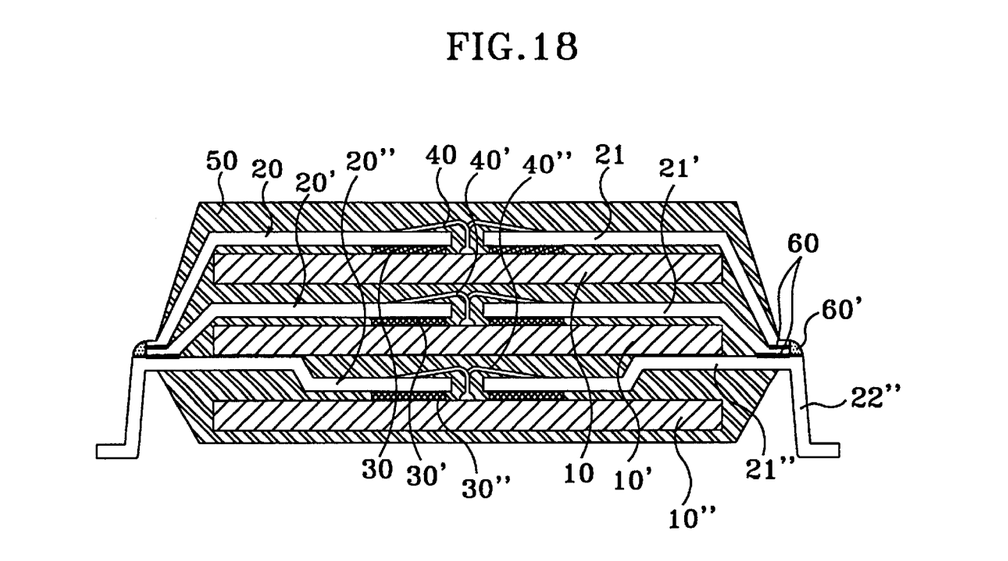
FIG. 18 is a cross-sectional view of a stack package according to a fifth embodiment of the present invention.

FIG. 18 is a cross-sectional view for showing a stack package according to a fifth embodiment of the present invention. As a different method from other embodiments, there are three semiconductor chips 10,10',10" in the stack package of the fifth embodiment.

Referring to FIG. 18, the respective semiconductors 10,10',10" are stacked in an vertical direction such that their bonding pad-disposed faces are formed upwardly. First, second and third lead frames 20,20',20" are electrically connected to the bonding pad-disposed faces of the respective semiconductor chips 10,10',10" by means of metal wires 40,40',40". The entire resultant structure is molded with an epoxy compound 50.

The respective semiconductor chips 10,10',10" include a plurality of bonding pads being disposed at center regions of the respective semiconductor chips with a regular spacing. The first and second lead frames 20,20' comprise only inner leads 21,21' which are not exposed from the epoxy compound 50. On the other hand, the third lead frame 20" includes an inner lead 21" which is not exposed from the epoxy compound 50 and an outer lead 22" which is extended from the inner lead 21" and is projected outside of the epoxy compound 50. Since the inner leads 21,21' of the first and second lead frames 20,20' are electrically connected to the inner lead 21" of the third lead frame 20", a signal of corresponding pads is inputted/outputted via one path. Furthermore, the respective lead frames 20,20',20" are appropriately set upwardly/downwardly for obtaining wire bonding spaces. That means, the inner leads 21,21' of the first and second lead frames 20,20' are set upwardly and the inner lead 21" of the third lead frame 20" is locally set downwardly.

The fabricating method and constitutions of the stack package according to the fifth embodiment are identical to those of the stack package according to the first embodiment except the number of semiconductor chips where three semiconductor chips are used in the present embodiment. Herein, detail description is omitted.

As noted, capacity of the package can be doubled and simultaneously its thickness is minimized since the stack package includes at least two semiconductor chips within one package.

Also, the package can be made of the materials and fabricated by the technology which are currently used in a common resin-molding type semiconductor package, manufacturing cost can be reduced remarkably and mass-production is available.

Further, the stack package according to the present invention is easy to handle and has improved electrical property since the signal transmitting path to external devices is short in a structural aspect.

Although preferred embodiments of the stack package are described and illustrated, various other modifications will be apparent to and can be readily made by those skilled in the art without departing from the scope and spirit of the present invention.

What is claimed is:

1. A chip stack package comprising:

at least two semiconductor chips stacked up and down, which comprise a plurality of bonding pads arranged along a center of the respective semiconductor chips in one package;

lead frames attached to bonding pad-disposed faces of the respective semiconductor chips, wherein the lead frames have inner leads electrically connected to each other, and one among the at least two semiconductor chips having an outer lead;

a conductive adhesive coated at interface between outer ends of the lead frames having only the inner lead and the lead frames having both the inner and outer leads;

a metal wire for electrically connecting the inner leads of the lead frames and the bonding pads;

an epoxy compound for entirely molding a resultant structure so as to expose only the outer lead which is provided with the one lead frame; and a connecting hole formed at the outer ends of the inner leads of the lead frames not having the outer lead so as to increase contact area with the lead frame having the outer lead.

2. The stack package of claim 1, wherein the conductive adhesive is selected from Sn, Sn/Ag, Sn/Pb or Ag solder material.

3. The stack package of claim 1, wherein the conductive adhesive is made of an isotropic or an anisotropic conductive epoxy.

4. The stack package of claim 1, wherein the outer ends of the respective inner leads are exposed from the epoxy compound, and a solder joint for aiding an electrical connection is formed at a portion of the lead frame having the outer lead to which the outer ends of the respective inner leads are contacted.

5. The stack package of claim 1, wherein the connecting hole is formed in a semicircular, circular or rectangular shape.

6. The stack package of claim 1, wherein width of the lead frames not having the outer lead is smaller than that of the lead frame having the outer lead.

* * * * *